United States Patent [19]

Yasue et al.

[11] 4,155,650
[45] May 22, 1979

[54] MICRO-ARTICLE PROCESSING SYSTEM

[75] Inventors: Itaru Yasue; Etsuji Suzuki, both of Yokohama, Japan

[73] Assignee: Tokyo Shibaura Electric Co., Ltd., Japan

[21] Appl. No.: 728,971

[22] Filed: Oct. 4, 1976

[30] Foreign Application Priority Data

Jun. 30, 1976 [JP] Japan .................................. 51-77407

[51] Int. Cl.$^2$ ....................... G01B 11/00; G01B 11/26
[52] U.S. Cl. ..................... 356/400; 250/561; 356/387
[58] Field of Search ............... 356/172, 167, 153, 209, 356/71; 250/224 R, 548, 557, 566, 553, 561, 223 R; 340/146.3 F, 146.3 G, 146.3 Q; 350/81

[56] References Cited

U.S. PATENT DOCUMENTS

| | | | |
|---|---|---|---|
| 3,643,098 | 2/1972 | Willits | 250/548 |
| 3,806,253 | 4/1974 | Denton | 356/160 |
| 3,937,928 | 2/1976 | Sasaki et al. | 340/146.3 F |
| 3,941,985 | 3/1976 | Kawase et al. | 350/81 |

OTHER PUBLICATIONS

Eisenstadt et al., "Automatic Semiconductor Positioning System", IBM Tech. Disc. Bull., vol. 14, 4-72, pp. 3370-3371.
Khoury H.A., "2-D Area Array Solid-State Feedback Automatic Wafer Alignment System", IBM Tech. Disc. Bull., 3-75, pp. 2890-2892.
Moore, R. L., "High-Speed Servo Positioner Bonds Mesa Transistors", Electronics, 2-8-63, pp. 58-61.

*Primary Examiner*—John K. Corbin
*Assistant Examiner*—Wm. H. Punter
*Attorney, Agent, or Firm*—Finnegan, Henderson, Farabow & Garrett

[57] ABSTRACT

A system comprising a detector for detecting a shift of a optical pattern formed on a semiconductor pellet at a distance from the datum point set on both sides of the pattern and giving a signal indicative of said shift, and a bonding device for wire-bonding said pellet with the shift compensated which has been shifted correspondingly to the shift of the pellet.

13 Claims, 12 Drawing Figures

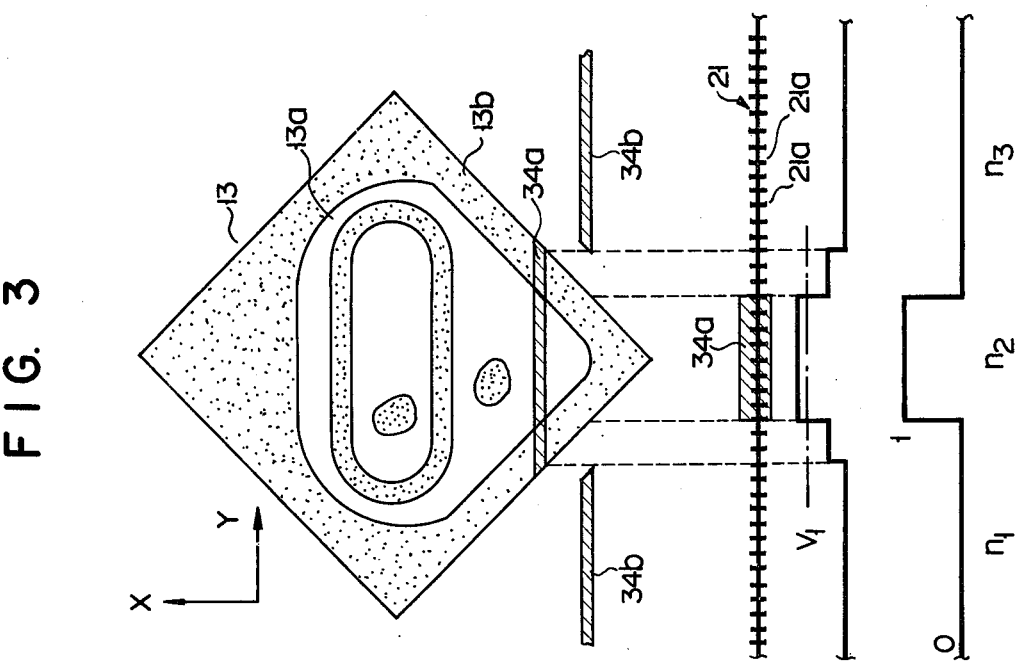
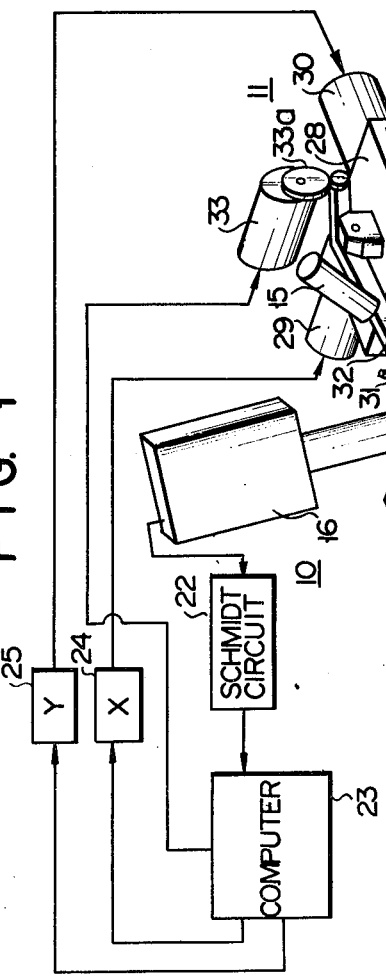
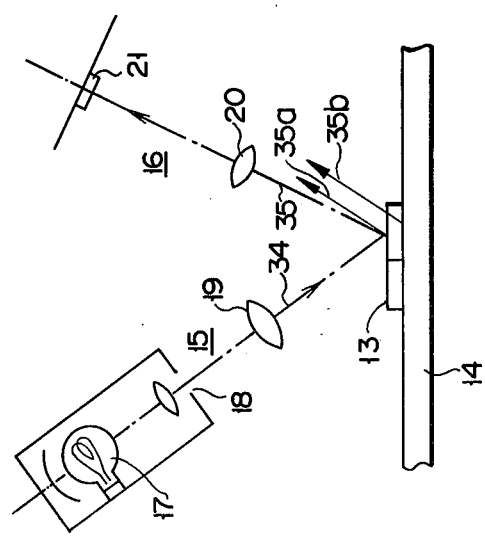

FIG. 5
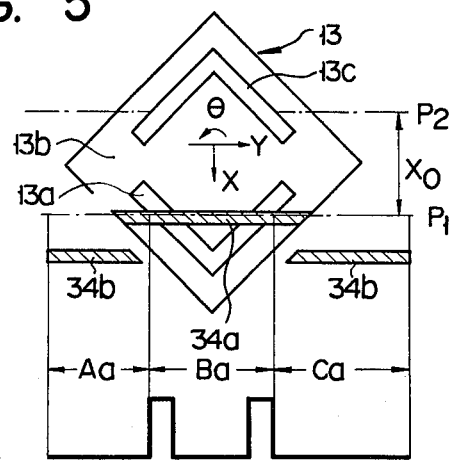
FIG. 5A
FIG. 6
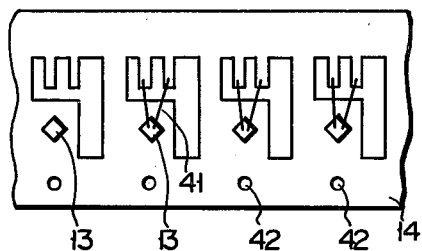
FIG. 7
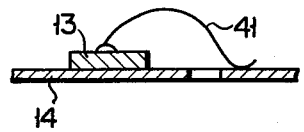
FIG. 8
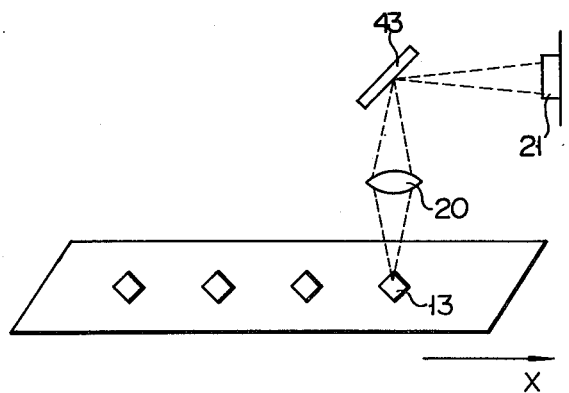

MICRO-ARTICLE PROCESSING SYSTEM

BACKGROUND OF THE INVENTION

The present invention relates to a micro-article processing system with an optical pattern, and more specifically to a micro-article processing system comprising a detector for detecting a shift of a micro-article and a device for performing prescribed processing independently of any shift of said micro-article by being shifted by a signal from said detector in such a manner as to compensate the shift.

In various fields of the art, a number of micro-articles are fed continuously to detect the shift of every individual article from the prescribed position thereof, and then a device in a subsequent process is shifted in response to said shift, thereby accomplishing desired operations. As a distinguished embodiment of such system is known a wire-bonding system for semiconductor pellets, which will be described hereinafter.

In a manufacturing process for some kinds of semiconductor elements, a pellet is attached to a lead frame and a fine wire is bonded to a specified area defined by a pattern formed on the surface of said pellet.

In this case, attaching of a pellet to said lead frame is generally accompanied by a substantial shift. Accordingly, in order to accomplish precise bonding, it is essential to provide a bonding device capable of detecting the shift of pellet correctly and performing bonding operation corresponding to such shift.

In the prior art, detection of said shift is performed by detecting a pattern formed on the surface of the pellet by an electrooptical method or by detecting a special detection mark previously formed on a pellet as a datum point. In general, the pattern on the surface of the pellet is both complicated and fine, so that the latter method in which a special mark is formed on a pellet is not preferable because it will place additional restrictions on the space for the complicated and fine pattern essential to a pellet. Meanwhile, as for the former method in which the entire pattern essential to the pellet is utilized, it is difficult to pick out a pattern required for detection out of complicated and fine patterns. Further, the patterns on the surface of any pellets generally vary with the types of pellets, so that it is also difficult to utilize such patterns for location of all these types of pellet. Thus such method is applicable to specific patterns only and may not be able to establish correct and easy detection of location.

SUMMARY OF THE INVENTION

Therefore, an object of the present invention is to provide a micro-article processing system having a detector capable of detecting a shift of a micro-article easily and correctly on the basis of a pattern formed on the micro article, such as a semiconductor pellet.

BRIEF DESCRIPTION OF THE DRAWING

FIG. 1 is a perspective view schematically showing a wire-bonding system according to an embodiment of the present invention;

FIG. 2 illustrates the optical system of a detector used in said system;

FIG. 3 is a top view of an optical pattern on a pellet to be bonded;

FIG. 3A is a diagram illustrating the relation between the reflected light from said pellet and the photo diode alley;

FIGS. 3B and 3C illustrate respectively an output signal from said alley and an output signal after rectification of wave form by means of a Schmidt circuit;

FIG. 5 is a diagram illustrating the relation between a pattern on a pellet to be bonded by means of the system shown in FIG. 4 and a light beam incident upon such pattern;

FIG. 5A illustrates an output wave form obtained from a light beam incident from said pattern by means of a photoelectric converter;

FIG. 6 is a top view of a lead frame with said bonded pellets;

FIG. 7 is an enlarged cross-sectional view of one of said bonded pellets; and

FIG. 8 is a diagram illustrating a reflector applicable to the detector of the system of the invention as well as an optical system.

DETAILED DESCRIPTION OF THE INVENTION

Figure 4:
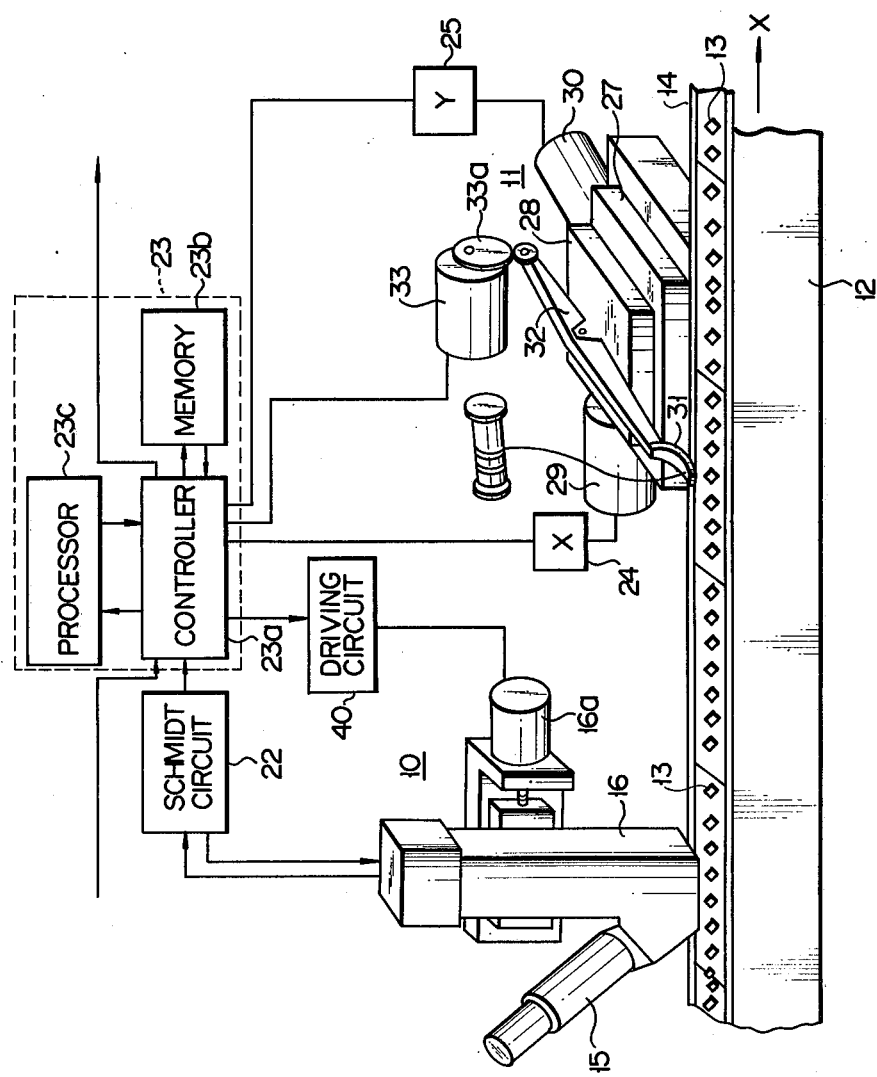
FIG. 4 is a perspective view illustrating the outline of a bonding system according to another embodiment of the present invention.

There will now be described a semiconductor pellet wire-bonding system as a micro-article processing system according to an embodiment of the present invention with reference to the accompanying drawings.

Referring to FIG. 1, the numerals 10, 11 and 12 indicate a shift detector, wire-bonding device and pellet transmitting device or feeder, respectively. The feeder 12 carries lead frames 14 with a number of semiconductor pellets 13, with a prescribed optical pattern formed on the top thereof, attached to the top surface thereof at regular intervals in a line or in the X-direction, and feeds said lead frames 14 intermittently in the X-direction by means of a conventional driving mechanism.

Said shift detector 10 comprises a lighting device 15 for applying light beams on to the semiconductor pellets 13 from above at an angle and an optical receiver 16 for receiving the light beams of the diffused reflection from the pellet 13. As shown in FIG. 2, the lighting device 15 is composed of a light source 17, a slit 18 for rectifying the light from the light source 17 into a slit beam, and a condensing lens 19 for concentrating the beams from the slit onto the pellet 13. Meanwhile, the optical receiver 16 is composed of a condensing lens 20 provided on an optical path at an angle narrower than the angle of incidence upon the pellet 13 so as to enable condensation of the diffused light reflected by the pellet 13, and a photoelectric converter 21 for receiving the convergent light from the lens 20 and giving an electric signal corresponding to the quantity of light. The optical axes of the lighting device 15 and optical receiver 16 are on the same plane with the feed direction of said pellet 13 or X-direction, and the slit beam from the slit 18 is extending in the Y-direction or the direction perpendicular to the X-direction. Said photoelectric converter 21 is constructed by a unidimensional photodiode array comprising a great number (n) of small photodiodes (e.g., 512 photodiodes) of the same dimensions continuously arranged in a line in the Y-direction and a shift register for scanning the respective diodes to produce an output signal corresponding to the light intensity incident in the diode array. The converter 21 has a function to amplify the outputs from the diode array and an oscillator for driving the shift register so as to produce a serial output signal with a predetermined level. The photoelectric converter 21 is connected to a Schmidt circuit 22 with a prescribed threshold level, which will modify the video signal or serial signal from the photoelectric converter 21 into the prescribed two bit signal (1 and 0). The output side of the Schmidt circuit 22 is connected to a computing circuit or micro computer 23 for making such calculation as mentioned hereinafter to figure out the shift in the X- and Y-directions of the pellet 13. The output side of the computing circuit 23 is connected to driving circuits 24 and 25 for operating the bonding device 11 in proportion to the shift by means of signals from the computing circuit 23 which indicate the X- and Y-direction shifts, thereby forming a shift detecting circuit.

Said bonding device 11 which disposed by the side of said pellet feeder 12 comprises a first table 27 movably mounted on a base 26 in the X-direction and a second table 28 movably mounted on said table 27 in the Y-direction. These two tables 27 and 28 may be moved to prescribed degrees in the X- and Y-directions respectively by pulse motors 29 and 30 rotated by the driving circuits 24, 25 of said shift detecting circuit through conventional transmitting means. On said Y-direction moving table 28 is supported a lever 32, vertically rotatable about its center portion as a pivot fulcrum, with its forward end portion extending over said pellet feeder and with a bonding capillary 31 attached to said extending end portion. The rear end of the lever 32 is in contact with an eccentric cam 33a mounted on the shaft of a pulse motor 33 driven by output signals from said computing circuit 23, and said lever 32 may be turned by the rotation of said cam 33a.

A semiconductor pellet usually has a complicated and fine optical pattern with light and shade or color formed on the surface thereof. Such a pattern is generally formed by an electrode, such as an aluminium layer, or a protective film, such as a silicon oxide film.

Now referring to FIG. 3, there is shown a pellet 13 with a pattern consisting of a diffused reflection portion and regular reflection portion out of various patterns. There will be described the shift detection in such a case hereinafter.

If said pellet 13 is intermittently carried by the pellet feeder in the X-direction to the position right under the bonding capillary, the pellet 13 will be applied with a slit beam 34 across its width by the lighting means 15 shown in FIG. 2 in such a manner as shown in FIG. 3. At this time point, as may be apparent from the drawing, the beam 34 is divided into two parts; a part 34a incident upon said pellet 13 and parts 34b incident upon the outside of the pellet or upon the lead frame 14. Further, the beam part 34a incident upon the pellet 13 may be divided into a part incident upon the diffused reflection portion 13a of the pattern and a part incident upon the regular reflection portion 13b. Said beam parts incident upon such three areas are reflected respectively, though a reflection beam 35 of the light incident upon said diffused reflection part may be mainly received because the photoelectric converter 21, as shown in FIG. 2, is disposed above the feeder at an angle narrower than the regular reflection angle. Therefore, the photoelectric converting means receives no reflected light from the portion of the beam outside the pellet. That is, a reflected light 35a from the regular reflecting portion 13b and the reflected light 35b from the lead frame 14 may not be received by the photoelectric converter 21. Since said pellet 13 has a prescribed thickness, there will be caused a cut section or so-called beam-breakage corresponding to the thickness of the pellet 13 between the beam part 34a incident upon the pellet 13 and the beam part 34b incident upon the lead frame. Consequently, even if some diffused reflection will be caused at the regular beam reflection portion 13b of the pattern and this reflected beam will be incident into the photoelectric converter 21. The output signal from this reflected beam may be definitely distinguished from the other output signals.

Thus, in the photoelectric converter 21 having a unidimensional photo-diode array composed of a number of photodiodes arranged in series, the light reflected from said diffused reflection portion 13a is incident upon the diodes in an area corresponding thereto, such situation being illustrated in FIG. 3A. In this drawing a beam 34a is shown to be incident upon eight diodes out of a number of diodes 21a, which are substantially located at the middle portion though more diodes will actually correspond to said portion 13a and receive the light therefrom. Some diodes other than these will generally receive light of small intensity so that the output signal from the photoelectric converter 21 will generally become such a video signal as shown in FIG. 3B.

The video signal will be sent to a Schmidt circuit 22 with a threshold level at V1, shaped into a 2-digit signal divided by the interface between the diffused reflection portion and regular reflection portion of a pattern, and fed into the computing circuit 23, where the shifts of a pellet in the X- and Y-directions will be calculated on the basis of said input signal in the following procedure. First, with the diodes, both of which provide a reference signal, at both ends given as datum points, the numbers $n_1$ and $n_3$ of diodes respectively from these points to the "1" signal and the remainder of the total number n of diodes subtracted by $n_1$ plus $n_3$ or the number $n_2$ of diodes corresponding to the diffused reflection portion of a pattern are calculated. Then the distance corresponding to number of $\frac{1}{2}(n_3 - n_1)$ is found to figure out the shift in the Y-direction and a signal corresponding to such shift is transmitted to the Y-direction driving circuit 25. Where $n_3 - n_1 = 0$, however, there should be no shifts in the Y-direction, so that it is unnecessary to operate the driving circuit 25.

At the same time, the shift in the X-direction is calculated and the X-direction driving circuit 24 is operated in response thereto in the following manner. With a prescribed position in the X-direction predetermined, the number $n_4$ of corresponding diodes representing this predetermined relationship at such point of time is set beforehand, and then said detected value $\frac{1}{2}n_2$ is subtracted from the set point $\frac{1}{2}n_4$. The number of $\frac{1}{2}(n_4 - n_2)$ corresponds to the shift because the X- and Y-directions are perpendicular to each other, while the distance may be figured out by multiplying said value by the length of a diode.

The aforesaid calculation may applicable to the case where the pattern has bisymmetrical portions with a rectangular cross as shown in the figure. In detecting a shift of a pellet with an asymmetrical or non-perpendicular pattern, however, there will be required proper mathematical correction, which may easily be performed on the level of the art.

Referring now to FIGS. 4 to 7, there will be described a bonding system according to another embodiment of the present invention hereinafter. In these drawings, detailed descriptions of those portions substantially similar to those of the first embodiment will be omitted by affixing a corresponding numeral to each of them.

In the system of this embodiment, a detector 10 is provided at some distance from a bonding device 11, and first the shift of a pellet 13 to be fed in the X-direction by a feeder 12 is detected by said detector 10, and then the pellet is transferred intermittently to the bonding device 11, where proper bonding is to be performed by the operation of said bonding device 11 to a degree corresponding to the shift detected by said shift detector 10. A lighting means 15 and optical receiver 16 used in this embodiment are so designed as to be capable of moving integrally a prescribed micro distance in the X-direction by means of a driving mechanism 16a. A computing circuit or micro-computer 23 includes a control circuit 23a for receiving an electric signal from a photoelectric converter 16 through a threshold circuit 22, a memory circuit 23b for storing a signal from said control circuit 23a and reading out the information on occasion, and an operation circuit 23c for calculating a shift. The micro-computer 23 supplies an output signal for shifting said optical receiver 16 and lighting means 15 by operating said driving mechanism 16a through a driving circuit 40 as well as an output signal corresponding to the shift for shifting a first table 27 and second table 28 of the bonding device respectively by operating Y- and X-direction driving circuits 25 and 24 and an output signal for operating bonding action by driving a motor 33 to rock an arm 32.

There will now be described the aforementioned system by referring to compensation of shift of a semiconductor pellet 13 having two V-shaped patterns 13a and 13c opposite to each other as shown in FIG. 5. Said V-shaped patterns are a part of the pattern essential to the semiconductor pellet or a pattern specially provided for detecting locations which is composed of a material diffused reflecting any light incident on the surface, such as an aluminium film 13a and 13c, while the top surface of the pellet 13 excepting said patterns 13a and 13c is covered with a material regularly reflecting the light, such as a silicon oxide film 13b.

When a slit beam is applied by the lighting means to one V-shaped pattern 13a at a level indicated by P1 in such a manner as to intersect both sides of said pattern 13a, the lighted position of the surface of the pellet 13 will deviate from that of other areas as shown by 34a and 34b due to the light breakage effect because the top surface of the pellet 13 is at a higher level as compared with the lead frame. If the position of the unidimensional photo diode array composing said photoelectric converter is set at a position where neither the regular reflected light from the surface of the pellet 13 nor the reflected light from the lead frame should be received, only the total reflected light from the V-shaped pattern 13a will be incident upon the photoelectric converter, while the output signal therefrom through the Schmidt circuit 22, as shown in FIG. 5A, will present its peak value at an area opposite to the V-shaped pattern 13a. That is "0" signals may be obtained from diodes Aa and Ca disposed in positions corresponding to the area from each end of the diode array to the pattern 13a and those diodes corresponding to inside each side of the V-shaped pattern 13a, while "1" signals may be obtained from those diodes in positions corresponding to the pattern 13a.

The output signals thus obtained at the level P1 are to be once stored in the memory circuit 23b through the control circuit 23a. Then the signals are transferred to the operation circuit 23c, where the numbers Aa, Ba and Ca of photo diodes in positions corresponding to said areas Aa, Ba and Ca are to be figured out. The information of these numbers of diodes are stored in the memory circuit 23b. Meanwhile, said control circuit 23a gives signals corresponding to a prescribed sequence to a motor driving circuit, thereby operating a motor or shifting mechanism 16a to a fixed degree. As a result, the shift detector is moved a fixed displacement $X_0$, the other detecting level P2 of said pellet 13 is scanned, and the numbers Ab, Bb and Cb of diodes identified by the pattern as projected at said level P2 are figured out in such procedure as the case of said first level P1. These numbers Ab, Bb and Cb of diodes are also to be stored in said memory circuit 23b.

After completion of the aforesaid operations, the shift detector 16 is returned again to said first level P1 by driving said shifting mechanism 16a, then the numbers Aa, Ba and Ca, and numbers Ab, Bb and Cb of photo-diodes corresponding respectively to said first and second levels stored in said memory circuit 23b are read out by the control circuit 23a and fed into the operation circuit 23c. In said operation circuit 23c, the shifts $\Delta x$ and $\Delta y$ in the X- and Y-directions respectively (The direction indicated by an arrow is to be positive in FIG. 5) from said respective numbers of photo-diodes may be calculated according to the following formula.

$$\Delta\theta = \tfrac{1}{2}\cdot(1/\sqrt{2L}-2X_0)\{2L+(Aa-Ca)+(Ab-Cb)\} \quad (1)$$

$$\Delta x = \tfrac{1}{2}(Bb-Ba) \quad (2)$$

$$\Delta y = \tfrac{1}{4}(2Aa+Ba+2Ab+Bb)-L/2(Bb-Ba)\Delta\theta \quad (3)$$

Where L is the total length of the photo diode alley or distance between the two diodes at both end of said photo diode array, $L=(Aa+Ba+Ca)\times$(Length corresponding to length of each diode)$=(Ab+Bb+Cb)\times$(Length corresponding to length of each diode).

Said V-shaped patterns 13a and 13c are to be so opposed to each other that each two adjacent sides of both patterns perpendicular to each other should form a square with each side length of 1 when extended and joined with each other. The calculated shifts $\Delta x$ and $\Delta y$ as a result of the above operation are stored again in the memory circuit 23b through instruction signals from the control circuit 23a. Said detector is so set that the calculating and storing operations for said shifts should be finished before completion of bonding of the pellet right under the bonding device 11.

After completion of said bonding process, the lead frame 14 is step-fed in the X-direction by the feeder 12, subsequent pellets are located right under the bonding device 11 and detector 16 respectively, and then the aforementioned operation is repeated. Thus, the shift of a pellet is calculated and stored in the memory circuit 23b each time the lead frame 14 is fed a step. When the pellet with its shift calculated is transferred to the bonding device, the first and second tables 27 and 28 of the bonding device are or have been moved a distance corresponding to said shift, and the prescribed bonding operation or attaching of a wire 41 to the pellet 13 as shown in FIGS. 6 and 7 is carried out. A hole 42 of FIG. 6 is a locating hole into which a locating pin may be inserted, thereby locating the lead frame 14.

As mentioned hereinbefore, a shift is detected by the shift detector 10, and the numbers Aa, Ba and Ca of photodiodes are calculated on the basis of the information from said detector in calculation of the shift at the operation circuit 23c, while if said numbers are not within a fixed range, the attaching position of the pellet 13 relative to the lead frame should be extremely deviated. If said numbers of diodes cannot be calculated at all, it may be judged that the pellet 13 is not attached to the lead frame 14. In both of these cases, the control circuit 23a will sends the bonding device an instruction signal to the effect that the bonding device should be prevented from operating even when the pellet has reached the bonding position. If such a phenomenon presents itself repeatedly, there will be given signals respectively for stopping the device in operation, for stopping the device in the previous process, and for lighting an emergency lamp for notifying abnormality from the control circuit 23a, assuming troubles in an automatic machine for attaching the pellet 13 to the lead frame 14 in the preceding process.

In the embodiments mentioned above, the pellet is attached and bonded to the lead frame with its four sides inclined at an angle of 45° to the longitudinal direction of said lead frame, while the pellet may also be attached with its two opposite sides perpendicular to the longitudinal direction of the lead frame. In the latter case, however, it is required to take a proper measure, such as turning of the shift detector as well as the pellet.

The shift detector of the system as described above with reference to FIG. 4 may also be used for detecting the shift of a pellet at the bonding device in the same manner as the embodiment described above with reference to FIG. 1. Further, said photoelectric converter may be of a type composed of arranged photoelectric converting elements, such as photo transistors, other than the unidimensional photo-diode array. The arrangement of said photoelectric converting elements should not be limited to a unidimensional type, but it may be of two-or-more-dimensional type. In this case, a mask with a slit, if required, may be provided in front of the photoelectric converter. Furthermore, the photoelectric elements may be substituted by any converting means, such as a pickup tube, capable of converting a photo signal into an electric signal.

In said respective embodiments of the present invention, the pellet is substantially shifted, and such shift may render it impossible for the photoelectric converter to receive the reflected light from the pellet. In order to compensate said shift, a deflecting means or reflector 43 should preferably be provided in front of the photoelectric converter 21, as shown in FIG. 8.

The reflector 43, attached rotatably, will be turned to change said relative position, thereby providing such relation between the pellet and the photoelectric converter as described in said respective embodiments. The rotation of the reflector 43 is stopped when a fixed level is reached by the maximum value of a signal which may be obtained by integrating the 2-bit signal, obtained when the photoelectric converter receives the prescribed reflected light from the pattern as the reflector rotates, by means of an integrated circuit (not shown).

What we claim is:

1. A semiconductor bonding system comprising a feeder for feeding successively in an X-direction a number of semiconductor pellets with a given optical pattern, the pellets being arranged within a prescribed orientation as to the direction of movement; a detector for detecting a shift of a semiconductor pellet on the feeder, said detector having lighting means for applying a ray of light of a prescribed width to the semiconductor pellet, said ray extending in the direction perpendicular to the X-direction to said pellet; photoelectric converting means including a unidimensional photoelectric converting array arranged in a line in the Y-direction for receiving light bearing pattern information according to breaks in the reflected light caused by the pattern of said semiconductor pellet and giving an output signal including a pattern signal corresponding to said pattern and a reference signal indicating a datum point at each side of said pattern signal, and computing means for receiving said output signal and said reference signal, calculating the distances from said datum points to the pattern signal, and giving an output signal indicating X- and Y-directions of said semiconductor pellet on the basis of such calculation; and a bonding device having a bonding means and moving means to shift the bonding means in X- and Y-directions by the distances corresponding to the shift of the semiconductor pellet detected by said detector.

2. A system according to claim 1 wherein said pellet contains a V-shaped reflection pattern.

3. A system according to claim 2 wherein said reflection pattern comprises an aluminum film.

4. A system according to claim 1 wherein said pellet contains two opposed V-shaped reflecting patterns, the patterns with their projections forming a square.

5. A system according to claim 4 wherein said reflection patterns comprise an aluminum film.

6. A system according to claim 4, including means for detecting an angular shift in said pellet.

7. A system according to claim 2, wherein the outer edges of both legs of said V-shaped pattern are at an angle of 45 degrees with the line of direction of movement of the pellet.

8. A system according to claim 4 wherein the outer edges of both legs of each of said V-shaped patterns are at an angle of 45 degrees with the line of the direction of movement of the pellet.

9. A semiconductor bonding system comprising a feeder for feeding successively in an X-direction a number of semiconductor pellets with a given optical pattern, the pellets being arranged within a prescribed orientation as to the direction of movement; a detector for detecting a shift of a semiconductor pellet on the feeder, said detector having lighting means for applying a ray of light of a prescribed width to the semiconductor pellet, said lighting means including an optical system for applying a slit beam extending in the direction perpendicular to the X-direction to said pellet; photoelectric converting means for receiving light-bearing pattern information according to the pattern of said semiconductor pellet and giving an output signal including a pattern signal corresponding to said pattern and a reference signal indicating a datum point at each side of said pattern signal, said photoelectric converting means including a unidimensional photoelectric converting array having a number of uniform photoelectric converting elements arranged in a line in the Y-direction to receive reflected light of said beam from said pellet to give a pattern signal, photoelectric converting elements on both sides of the array providing said datum points, and computing means for receiving said output signal and said reference signal, calculating the distances from said datum points to the pattern signal, and giving an output signal indicating X- and Y-directions of said semiconductor pellet on the basis of such calculations; and a bonding device having bonding means and moving means to shift the bonding means in X- and Y-directions by the distances corresponding to the shift of the semiconductor pellet detected by said detector.

10. A system according to claim 9 wherein said computing means gives a signal indicating a shift of the pellet in the Y-direction by calculating the respective distances between the photoelectric element giving said pattern signal and each of said datum point photoelectric elements as a function of the number of photoelectric elements disposed therebetween.

11. A system according to claim 10 wherein the X- and Y-direction relationships of said pattern are predetermined and said computing circuit gives a signal indicating the shift of the pellet in the X-direction derived from said shift in the Y-direction.

12. A system according to claim 9 wherein said photoelectric converting means is provided with a deflecting means for leading the light from a pellet to said photoelectric converting element array by changing the optical relative position of said pellet to said photoelectric converting element array.

13. A system according to claim 9 wherein said lighting means emits the beam outside of the pellet and said photoelectric converting means receives no reflected light of the portion of the beam outside the pellet.

* * * * *